Figure 1:
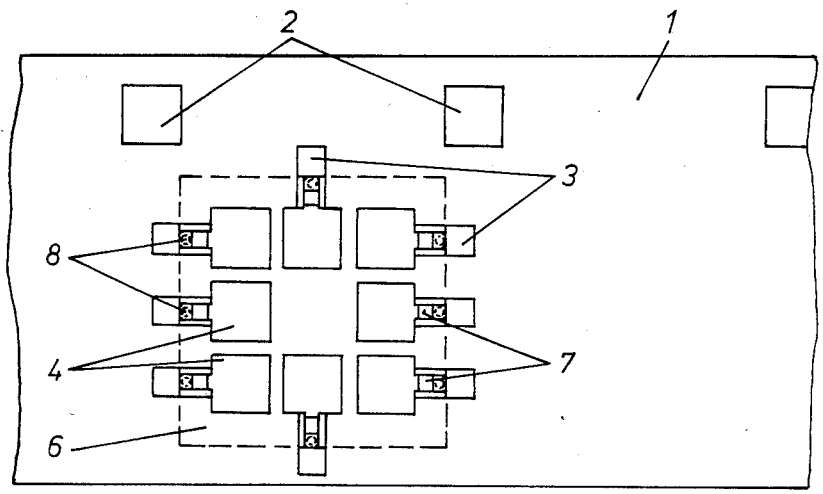

United States Patent [19]

Hoppe et al.

[11] Patent Number: 4,549,247
[45] Date of Patent: Oct. 22, 1985

[54] CARRIER ELEMENT FOR IC-MODULES

[75] Inventors: Joachim Hoppe; Yahya Haghiri-Tehrani, both of Munich, Fed. Rep. of Germany

[73] Assignee: GAO Gesellschaft für Automation und Organisation mbH, Fed. Rep. of Germany

[21] Appl. No.: 317,873

[22] Filed: Nov. 3, 1981

[30] Foreign Application Priority Data

Nov. 21, 1980 [DE] Fed. Rep. of Germany ....... 3043877
Dec. 8, 1980 [DE] Fed. Rep. of Germany ....... 3046192

[51] Int. Cl.$^4$ ............................................. H05K 1/18
[52] U.S. Cl. ................. 361/398; 174/52 FP; 235/487; 361/406; 361/403
[58] Field of Search ............ 361/406, 398, 421, 403, 361/404, 400, 401, 402, 405; 174/68.5, 52 FP; 357/80, 68, 69, 70, 71, 74; 339/17 F, 17 LM, 17 CF; 29/841, 831; 235/492, 487; 360/2; 283/83

[56] References Cited

U.S. PATENT DOCUMENTS 3,649,950 4/1972 Gluntz ................................. 361/406
3,781,596 12/1973 Galli et al. ......................... 361/398
3,868,724 2/1975 Perrino ............................ 357/80 X
4,064,552 12/1977 Angelucci et al. ................. 361/414
4,139,881 2/1979 Shimizu et al. .................... 361/400
4,177,519 12/1979 Kasubuchi et al. ................. 361/398
4,246,595 1/1981 Noyori et al. ........................ 357/71
4,460,825 7/1984 Haghiri-Tehrani et al. ........ 235/487

FOREIGN PATENT DOCUMENTS 2439478 5/1980 France .
1524776 9/1978 United Kingdom .
2081974 2/1982 United Kingdom ........... 174/52 PE Primary Examiner—Reinhard J. Eisenzopf
Assistant Examiner—Gregory D. Thompson
Attorney, Agent, or Firm—Andrus, Sceales, Starke & Sawall

[57] ABSTRACT

A carrier element for IC modules, whereby several leads are arranged on a carrier film, which leads are each connected at one end with a terminal of the module and run into a contact surface at the other end. Whereas the contact surfaces are arranged on the side of the film not touching the module within the periphery of the module, the outer leads are connected with the corresponding terminals of the module through punched out windows in the film. The carrier element thus has a very compact form, the area of which is adapted to the size of the IC module.

9 Claims, 6 Drawing Figures

CARRIER ELEMENT FOR IC-MODULES

The invention relates to a carrier element for IC modules, in which the module is soldered to a contact frame having a spider-like pattern in such a way that the leads of the frame are connected with the corresponding terminals of the module at one end (outer leads) and run into contact surfaces at the other end.

Customarily IC modules are incorporated into casings that are easy to handle, e.g. into so-called "dual-in-line packages", which have a large volume relative to the dimensions of the module. This has unfavorable effects especially in the case of complex circuit arrangements when the latter are to be housed in as small a space as possible.

It has therefore been proposed that the IC modules be processed in an unencapsulated form, whereby the module is mounted, for example, on a firm strip to facilitate handling. In this connection the so-called "micropack arrangement" (see the special publication of the Siemens company "bauteile report" 16, 1978, Book 2, p.40-44) has become known, which can be used advantageously wherever only a very limited incorporation volume is available for a circuit arrangement (circuits for watches, hearing aids, etc.).

The basic material for the arrangement mentioned is a thermally stable film strip. Equally spaced windows adjusted to the dimensions of the module are punched out of this film strip. The film strip is coated with a conductive material out of which leads are etched in such a way that their unsupported ends extend into the window area. Finally, the terminals of the module are connected with the corresponding ends of the leads. The open ends of the leads run into freely accessible contact surfaces and are arranged on the film in a circle around the window area. Thus micropack arrangements can also be soldered by hand e.g. into printed circuits of the usual construction, if need be.

It has also been proposed recently that unencapsulated modules of the kind mentioned be incorporated e.g. into identification cards or similar data carriers. In such cases it must be taken into consideration that identification cards are exposed to great strain in their daily use, so that as small a structural shape as possible should be aimed at. On the other hand, the contact surfaces on the film bearing the module should be designed from the start in such a way that direct contacting is possible when the card is used in automata, e.g. by means of contact pins.

As mentioned above, the contact surfaces, which must have a minimal area of 1-2 mm$^2$ in the case of galvanic contacting in an automaton, are arranged in a circle around the window area, the entire arrangement has considerably larger dimensions than the IC module itself.

The object of the invention consists in proposing a carrier element for IC modules having smaller dimensions better adapted to the IC module relative to the arrangements known up to now.

The object is achieved according to the invention by arranging the contact surfaces above the module on the side of the film not touching the module within the periphery of the module, and connecting the outer leads with the corresponding terminals of the module by punched-out windows in the film.

The solution according to the invention yields compact, film bonded IC carrier elements adapted to the area of the IC module, which can be used wherever only very small areas are available for incorporation.

The small dimensions of the IC carrier element means that the surface exposed to mechanical stress is also small. For this reason it is particularly suitable for the incorporation in carriers, e.g. identification cards, which are subject to great mechanical stress in the course of their use.

Further details of the invention emerge from the embodiments described in the following.

Figure 2:
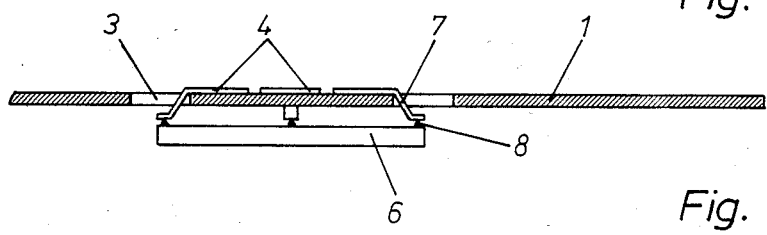

The figures show:

FIG. 1 an arrangement according to the invention, from the top,

FIG. 2 the arrangement of FIG. 1 in cross-section and

FIGS. 3-6 further embodiments of the invention.

In the embodiment shown in FIGS. 1 and 2 the IC module 6 is mounted on a film strip 1. The perforation 2 that is customarily present in film strips, e.g. in super-8 films, can be used for the transport of the film during the production phases of the carrier element.

Contact surfaces 4 are arranged on the film strip, of which the leads 7 (outer leads) are connected with the corresponding terminals 8 of the IC module 6 (see FIG. 2 as well).

The contact surfaces 4 are selected in respect to their arrangement and their dimensions in such a way that during the coupling of the carrier element to an electrical device, direct contacting is possible, e.g. with suitable contact pins. The outer leads 7 are arranged over windows 3 punched out of the film 1. In a preferred embodiment the windows 3 are designed in such a way that the unsupported outer leads extend into the window area 3 and thus can be connected with the IC module through the windows during contacting.

The first step in the production of the carrier element is to subject the film 1 to a punching process at regular intervals, resulting, for example, in the punching pattern with the windows 3 as shown in FIG. 1. Then one side of the film is coated with a conductive layer, out of which the leads (4,7) necessary for the mounting of the IC module are etched by the known techniques.

In the embodiment shown, the leads are etched in such a way that the contact surfaces 4 result on the film 1 over the module surface within the periphery of the module and the outer leads 7 that are to be connected with the module result over the punched out windows.

To complete the carrier element the outer leads 7 are directed through the punched out windows 3 of the film onto the terminals 8 of the IC module 6 and connected with the latter by a soldering process.

As shown in FIG. 2 the module - flexibly mounted - can be contacted at a predetermined distance from the film 1. If only very little depth is available for the incorporation of the carrier element for the later purpose of application, the module 6 can be connected with the outer leads directly against the film, e.g. by gluing.

Figure 3:
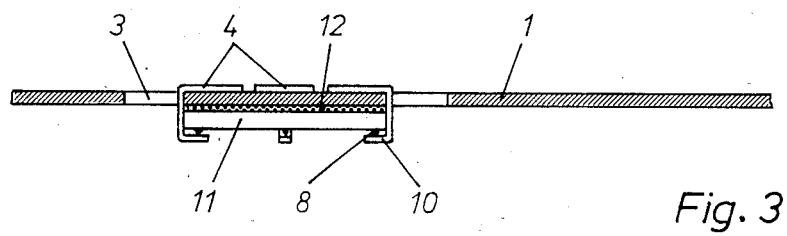
Figure 4:
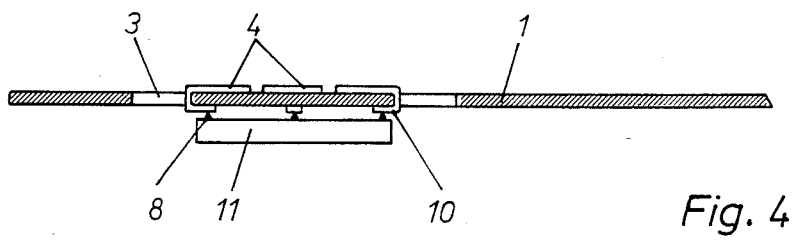

In the carrier elements shown in FIGS. 3 and 4 the outer leads of the contact surfaces are prepared in such a way that IC modules having terminals closer together than in the first examples can also be mounted.

In the embodiment shown in FIG. 4 the outer leads 10 are bent through the punched out windows 3 onto the side of the film opposite the contact surfaces 4 before contacting the module 11. The terminals 8 of the module 11 are then connected with the leads 10.

In the embodiment shown in FIG. 3 the outer leads 10 are bent around the IC module through the punched out windows 3 of the film and then connected with the terminals of the module. The IC module can be attached to the film 1 by a suitable glue 12 before the bending process so that it is securely positioned during same.

Figure 5:
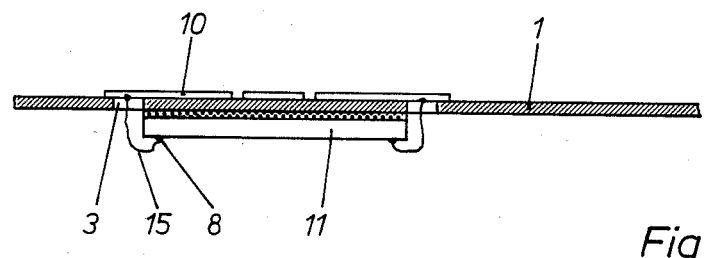

FIG. 5 shows an embodiment of the carrier element according to the invention in which the IC module 11 is contacted by the so-called bonding technique. In this case the terminals 8 of the module 11 are connected with the outer leads of the contact surfaces through the windows 3 of the film by fine golden wires 15. In this embodiment a form of the outer leads 10 in which they extend beyond the punched out windows 3, as shown, for example, in FIG. 5, can be useful.

Figure 6:
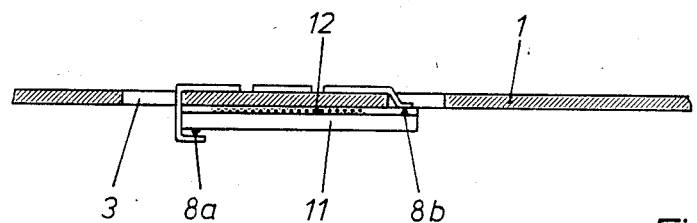

FIG. 6 shows an embodiment of the carrier element according to the invention in which an IC module 11 having terminals on the front and back sides 8a, 8b has been contacted. The contacting techniques used have been described in connection with FIGS. 2 and 3.

In addition to the possibility of etching the contact surfaces out of a conductive film coating, it has also become known to produce the elements in the form of a so-called "contact spider" in a separate procedural step independently of the carrier and/or the film.

The contact spider with the outer leads or contact surfaces is only attached to the film, for example, by means of an adhesive, during the contacting process. In the same procedural step the outer leads can be connected with the corresponding terminals of the module, as discussed on the basis of the figures.

All contact surfaces and the outer leads that go with them are processed together in the above-mentioned method, since they are elements of a common frame, the so-called contact spider.

On the other hand, it is also possible to produce the elements (contact surface plus lead) as single pieces and process them according to the invention. In this case the elements can be punched out of conductive material that may be connected with the carrier film if required, for example according to the "labelling principle".

What is claimed is:

1. An integrated circuit chip carrier element suitable for use in cards providing data to data sensors applied to the card, said carrier element comprising:
    an integrated circuit semiconductor chip having a plurality of terminals lying on the exterior of said chip and being generally flush with its surface;
    a thin, flexible carrier film having first and second surfaces, said integrated circuit semiconductor chip being positioned proximate to said second surface of said film so that the periphery of the integrated circuit chip defines a corresponding peripheral outline of said chip in said film, said film having a plurality of openings spaced along said outline of said integrated circuit semiconductor chip on said film, at least a portion of each of said openings lying outside said outline; and
    a plurality of leads, each having first and second ends and an intermediate portion between said ends, said first ends being affixed to said first surface of said film and comprising contact elements for receiving the data sensors, said contact elements lying on said first surface substantially within the outline of said integrated circuit semiconductor chip on said film, said intermediate portions of said leads extending through said openings, and said second ends of said leads being connected to said integrated circuit semiconductor chip terminals.

2. A carrier element as in claim 1 wherein said integrated circuit chip has terminals on a side facing said film and said intermediate portions are bent to fasten said second ends to said terminals.

3. A carrier element as in claim 1 wherein said integrated circuit chip has terminals on a side facing away from said film and said intermediate portions are bent to fasten said second ends to said terminals.

4. The carrier elements as in claim 1 wherein said integrated circuit terminals appear in said openings and said intermediate portions are bent to fasten said second ends of said leads to said terminals.

5. A carrier element as in claim 1 wherein said integrated circuit chip terminals lie sufficiently far in the interior of said outline of said chip as to not appear in said openings and wherein said intermediate portions are bent to fasten said second ends to said terminals.

6. A carrier element as in claim 5 wherein said integrated circuit chip terminals are on a side facing away from said film and wherein said intermediate portions are bent to fasten said second ends to said terminals.

7. A carrier element as in claim 5 wherein said integrated circuit chip terminals are on a side toward said film and wherein said intermediate portions are bent to fasten said second ends to said terminals so that said second ends are between said film and said integrated circuit chip.

8. A carrier element as in claim 1 wherein said integrated circuit chip has terminals on both sides and wherein said intermediate portions are bent to fasten second ends to said terminals.

9. The carrier element as in claim 1 wherein said integrated circuit chip is fastened to said film.

* * * * *